United States Patent
Ren et al.

(10) Patent No.: US 8,231,848 B1
(45) Date of Patent: Jul. 31, 2012

(54) ONE-POT SYNTHESIS OF CHALCOPYRITE-BASED SEMI-CONDUCTOR NANOPARTICLES

(75) Inventors: Yuhang Ren, Zhejiang (CN); Chivin Sun, Staten Island, NY (US); Kai Shum, Zhejiang (CN)

(73) Assignee: Sun Harmonics Ltd, Hangzhou, Zhejiang (CN)

( * ) Notice: Subject to any disclaimer, the term of this patent is extended or adjusted under 35 U.S.C. 154(b) by 0 days.

(21) Appl. No.: 13/443,114

(22) Filed: Apr. 10, 2012

(51) Int. Cl.
- B82Y 40/00 (2011.01)
- C01B 17/00 (2006.01)
- C01B 19/00 (2006.01)
- H01L 21/02 (2006.01)

(52) U.S. Cl. .......... 423/23; 423/111; 423/135; 423/495; 423/508; 423/511; 136/264; 257/E21.09; 257/42; 257/103; 438/95; 438/478; 438/795; 438/796; 977/773; 977/827

(58) Field of Classification Search .................. 136/264; 257/E21.09, 42, 103; 423/23, 111, 135, 495, 423/508, 511; 438/95, 478, 795, 796; 977/773, 977/827

See application file for complete search history.

(56) References Cited

U.S. PATENT DOCUMENTS

| | | | |
|---|---|---|---|
| 6,992,202 B1 | 1/2006 | Banger et al. | |
| 7,892,519 B2 | 2/2011 | Pak et al. | |
| 2008/0038558 A1 | 2/2008 | Landry et al. | |
| 2010/0329967 A1* | 12/2010 | Lu et al. | 423/508 |
| 2011/0039104 A1 | 2/2011 | Zhong et al. | |
| 2011/0152554 A1 | 6/2011 | Fox et al. | |

FOREIGN PATENT DOCUMENTS

| | | |
|---|---|---|
| CN | 200810101428 | 3/2008 |
| CN | 101746715 A | 6/2010 |
| CN | 101885509 A | 11/2010 |
| CN | 102070184 A | 5/2011 |
| WO | WO2008104087 A1 | 9/2009 |

OTHER PUBLICATIONS

Synthesis and Characterization of Colloidal $CuInS_2$ Nanoparticles from a Molecular Single-Source Precursor, ACS Publications, The Journal of Physical Chemistry; Pre 1997.
Nanocrystalline Chalcopyrite Materials ($ChInS_2$ and $ChInSe_2$) via Low-Temperature Pyrolysis of Molecular Single-Source Precursors, Castro et al. published on web Jun. 27, 2003.

(Continued)

Primary Examiner — Timothy Vanoy
(74) Attorney, Agent, or Firm — Lackenbach Siegel, LLP; Myron Greenspan

(57) ABSTRACT

Ternary and quaternary Chalcopyrite $CuIn_xGa_{1-x}S_ySe_{2-y}$ (CIGS, where $0 \leq x$ and $y \leq 1$) nanoparticles were synthesized from molecular single source precursors (SSPs) by a one-pot reaction in a high boiling solvent using salt(s) (i.e. NaCl as by-product) as heat transfer agent via conventional convective heating method. The nanoparticles sizes were 1.8 nm to 5.2 nm as reaction temperatures were varied from 150° C. to 190° C. with very high-yield. Tunable nanoparticle size is achieved through manipulation of reaction temperature, reaction time, and precursor concentrations. In addition, the method developed in this study was scalable to achieve ultra-large quantities production of tetragonal and quaternary Chalcopyrite CIGS nanoparticles.

20 Claims, 6 Drawing Sheets

OTHER PUBLICATIONS

A facile route to the synthesis of CuInS$_2$nanoparticles, Materials Letter 60 (2006) 2395-2398.

Preparation of Ultrafine Chalcopyrite Nanoparticles via the Photochemical Decomposition of Molecular Single-Source Precursors, Nano Letters 2006 vol. 6, No. 6 1218-1223.

Rapid synthesis and size control of CuInS$_2$semi-conductor Nanoparticles using microwave irradiation; J Nanpart Res (2008) 10:633-641.

A large-scale synthesis and characterization of quaternary CuInxGa1-xS2 Chalcopyrite Nanoparticles via microwave batch reactions; Hindawi Publishing Corporation; International Journal of Chemical Engineering; vol. 2011, Article ID 545234, 8 pages, 2011.

Synthesis and Characterization of Colloidal CuInS$_2$ nanoparticles from a molecular single-source precursor; 2004 American Chemical Society, published on web Jul. 27, 2004.

Nanocrystalline Chalcopyrite materials (CuInS$_2$ and CuInSe$_2$) via Low Temperature Pyrolysis of molecular single-source precursors, 2003 American Chemical Society, published on web Jun. 27, 2003.

A new facile route for the preparation of single-source precursors for bulk, thin-film and nanocrystallite I-III-IV seminconductors; Inorg. Chem, 2003, 42, 7713-7715.

Synthesis of cooper indium sulfide nanoparticles by solvothermal method; Material Letters 63 (2009) 1192-1194.

Controlled Synthesis and optical properties of colloidal ternary chalcogenide CuInS$_2$ nanocrystals, Chem. Matter 2008, 6434-6443.

Intermediate-band solar cells employing quantum dots embedded in an energy fence barrier, Nano letters, 2007, vol. 7, No. 1, 218-222.

High efficiency carrier multiplication in PbSe nanocrystals: implications for solar energy conversion, Physical review letters; vol. 92, No. 18 May 7, 2004.

Ideal theory of quantum well solar cells; Journal of Applied Physics; 78, 1850 (1995); doi: 10.1063/1.360219.

Quantum dot solar cells; Progress in photovoltaics; research and applications, Apr. 2002; 10:433-439.

Stability Issues of Cu(In, Ga) Se2- based solar cells; J. Phys. Chem. B 2000, 104, 4849-4862.

CuInSe$_2$ for photovoltaic applications, Journal of Applied Physics; 70, R81 (1991); doi: 10.1063/1.349175.

Properties of 19.2% efficiency ZnO/CdS/ CuInGaSe$_2$ thin-film solar cells; Progress in photovoltaics; research and applications, ApII. 2003; 11:225-230.

New developments in Cu(In, Ga) (S, Se)$_2$ thin film modules formed by rapid thermal processing of stacked elemental layers; Science direct; Solar energy materials and solar cells 90 (2006) 3115-3123.

Buffer layers in Cu(In, Ga) Se$_2$ solar cells and modules; Science direct; thins solid films 480-481 (2005) 99-109.

A high-yield synthesis of chalcopyrite CuInS$_2$ nanoparticles with exceptional size control, Hindawi Publishing Corporation; International Journal of Chemical Engineering; vol. 2009, Article ID 748567, 7 pages, 2009.

Stepwise Introduction of Thiolates in Cooper—Indium Binuclear Complexes; Inorg. Chem. 2010, 49, 3959-3961 3959.

Quantum Dot Solar Cells, Tuning photoresponse through size and shape control of CdSe—TiO$_2$ architecture; JACS articles published on web Mar. 1, 2008.

Improved quantum confinement of self-assembled high-density InAs quantum dot ,olecules in AiGaAs/GaAs quantum well structures by molecular beam epitaxy; J. Vac. Sci. Technol. B 26(3) May/Jun. 2008.

Control Stoichiometry for Quaternary CuIn$_x$Ga$_{1-x}$S$_2$ Chalcopyrite nanaparticles from single-source precursors via microwave irradiation; Chemistry of materials 2010, 22, 2699-2701 2699.

Synthesis and Characterization of Colloidal CuInS$_2$ Nanoparticles from a Molecular Single-Source Precursor, ACS Publications, the Journal of Physical Chemistry; Pre 1997.

Nanocrystalline Chalcopyrite Materials (ChInS$_2$ and ChInSe$_2$) via Low-Temperature Pyrolysis of Molecular Single-Source Precursors, Castro et al. published on web Jun. 27, 2003.

A facile route to the synthesis of CuInS$_2$ nanoparticles, Materials Letter 60 (2006) 2395-2398.

Rapid synthesis and size control of CuInS$_2$ semi-conductor Nanoparticles using microwave irradiation; J Nanpart Res (2008) 10:633-641.

A large-scale synthesis and characterization of quaternary CuInxGa1-xS2 Chalcopyrite.

Stability Issues of Cu(In, Ga) Se2-based solar cells; J. Phys. Chem. B 2000, 104, 4849-4862.

Properties of 19.2% efficiency ZnO/CdS/ CuInGaSe$_2$ thin-film solar cells; Progress in photovoltaics; research and applications, Apll. 2003; 11:225-230.

A High-Yield Synthesis of Chalcopyrite CuInS$_2$ Nanoparticles With Exceptional Size Control, Hindwai Publishing Corporation, Journal of Nanomaterials, vol. 2009, Article ID 748567, 7 pages; Received Aug. 21, 2009; Accepted Dec. 29, 2009.

* cited by examiner

ONE-POT SYNTHESIS OF CHALCOPYRITE-BASED SEMI-CONDUCTOR NANOPARTICLES

BACKGROUND OF THE INVENTION

1. Field of the Invention

The invention generally relates to methods and systems for forming particles (e.g., nanoparticles) and semiconductor devices using nanoparticles, and more specifically, to one-pot synthesis of chalcopyrite-based semi-conductor nanoparticles.

2. Description of the Prior Art

Semiconductor devices are devices that employ semiconductor materials, which are solid materials that exhibit an electrical conductivity lying between that of a conductor and that of an insulator. Semiconductor devices include, for example, diodes (e.g., light emitting diodes (LEDs)), photovoltaic devices, sensors, solid state lasers, and integrated circuits (e.g., memory modules and microprocessors).

Photovoltaic devices are semiconductor devices that convert photons (e.g., light) into electricity. For example, solar panels include photovoltaic devices that convert sunlight (i.e., photons originating from the sun) into electricity. Due to the ever-increasing demand for renewable energy sources, the market for photovoltaic devices has experienced an average annual growth rate of about twenty five percent (25%) over the previous decade.

Extensive research and development has resulted in photovoltaic materials and devices that are cheaper and more efficient. The cost of power produced by photovoltaic devices has decreased significantly over the past several decades, but must be further reduced to become competitive with alternative power sources, such as coal.

A majority of photovoltaic devices that are commercially available at the present time comprise photodiodes formed in silicon substrates. The performance of such silicon-based photovoltaic devices, is however, inherently limited by physical and chemical properties of silicon. New photovoltaic devices have been created that are based on light-absorbing materials (which may be either organic or inorganic) other than silicon. The number of non-silicon-based photovoltaic devices has steadily increased over the previous two (2) decades and currently accounts for over ten percent (10%) of the solar energy market. Non-silicon photovoltaic devices are expected to eventually replace a large portion of the market for silicon-based photovoltaic devices and to expand the solar energy market itself due to their material properties and efficient power generating ability. In order for solar power to be economically competitive with alternative fossil fuel power sources at their current prices, photovoltaic devices based on photoactive materials other than silicon must be improved and further developed.

Materials other than silicon that can be employed in photovoltaic devices include, for example, germanium (Ge), chalcopyrites (e.g., $CuInS_2$, $CuGaS_2$, and $CuInSe_2$), chalcogenides [$Cu(In_xGa_{1-x})(Se_yS_{1-y})_2$], cadmium telluride (CdTe), gallium arsenide (GaAs), organic polymers (e.g., polyphenylene vinylene, copper phthalocyanine, fullerenes), and light absorbing dyes (e.g., ruthenium-centered metalorganic dyes). Photovoltaic devices based on such materials have demonstrated greater photon conversion efficiencies than those exhibited by silicon-based devices. Furthermore, some non-silicon photovoltaic devices are capable of capturing a broader range of electromagnetic radiation than silicon-based devices, and as such, may be more efficient in producing electrical power from solar energy than are silicon-based devices.

Non-silicon photovoltaic devices may comprise thin films of photoactive materials, which may comprise polycrystalline materials or nanoparticles. The thin films of photoactive materials may be formed on flexible substrates such as polyethylene terephthalate (such as that sold under the trade name Mylar), which allows for a broad range of new configurations, designs, and applications for photovoltaic devices that were previously unavailable to silicon-based devices. Furthermore, thin film designs may use less than one percent (1%) of the raw materials used in conventional silicon-based devices, and therefore, may cost much less than silicon-based devices in terms of basic raw materials.

Manufacturing processes for thin films of photoactive materials include electroplating techniques, vapor deposition, flash evaporation, and evaporation from binary compounds, spray pyrolysis, and radiofrequency or ion beam sputtering of polycrystalline materials. Unfortunately, a majority of the costs associated in producing thin film photovoltaic devices are incurred in the thin film manufacturing techniques. In addition to being costly, existing thin film manufacturing processes tend to introduce a high number of defects into the films, which can result in an entire batch of material to be rendered inoperable. The next generation of photovoltaic devices would significantly impact the solar energy market if more efficient thin film manufacturing techniques and improved materials could be developed to overcome limitations of conventional processes and materials.

Growth of nanoparticles is highly dependent on the thermodynamic and kinetic barriers of the reaction. Conventional thermolysis relies on the conduction of blackbody radiation to drive the reaction, using the reaction vessel as an intermediary for the transfer of energy. This often causes sharp thermal gradients that create non-uniform thermal conditions resulting in non-uniform nucleation and particle growth.

Nanoparticles of the form $I-III-VI_2$ have been made by the decomposition of single-source precursors ("SSPs"), solid-state reactions of the metal powders, and multiple-source precursors. Traditionally, the formation of the nanoparticles from SSP is facilitated by thermolysis of the precursor, although there have been reports of the nanoparticles formed by photolysis. Despite the potential benefits of replacing traditional thermolysis with microwave irradiation, only a few types of nanoparticles have been prepared via microwave radiation thus far, including CdSe, PbSe, $Cu_{2-x}Se$, $CuInTe_2$, and $CuInSe_2$ nanoparticles from metal salts and CdSe, InP, and InGaP from respective SSPs.

SUMMARY OF THE INVENTION

In some embodiments, the present invention includes methods of forming particles in which a single source precursor in the presence of a heat transfer agent (by-product of the reaction) is subjected or exposed to heat or pyrolysis in a one-pot reaction. The single source precursor decomposes in the thermochemical, and a plurality of particles are formed from one or more products of the decomposition of the single source precursor.

Furthermore, in some embodiments, the particles formed may comprise nanoparticles. In yet further embodiments, the particles formed may comprise a chalcopyrite material.

In additional embodiments, the present invention includes methods of fabricating a semiconductor material in which a single source precursor heat transfer agent are subjected or exposed to heat to form a plurality of particles each comprising a semiconductor material.

In additional embodiments, the present invention includes devices such as, for example, semiconductor devices that include particles formed using embodiments of methods of the present invention, or that are otherwise fabricated using embodiments of methods of the present invention, as described herein.

BRIEF DESCRIPTION OF THE DRAWINGS

While the specification concludes with claims particularly pointing out and distinctly claiming that which is regarded as the present invention, advantages of this invention may be more readily ascertained from the following description of the invention when read in conjunction with the accompanying drawings in which:

DETAILED DESCRIPTION

Figure 1A:
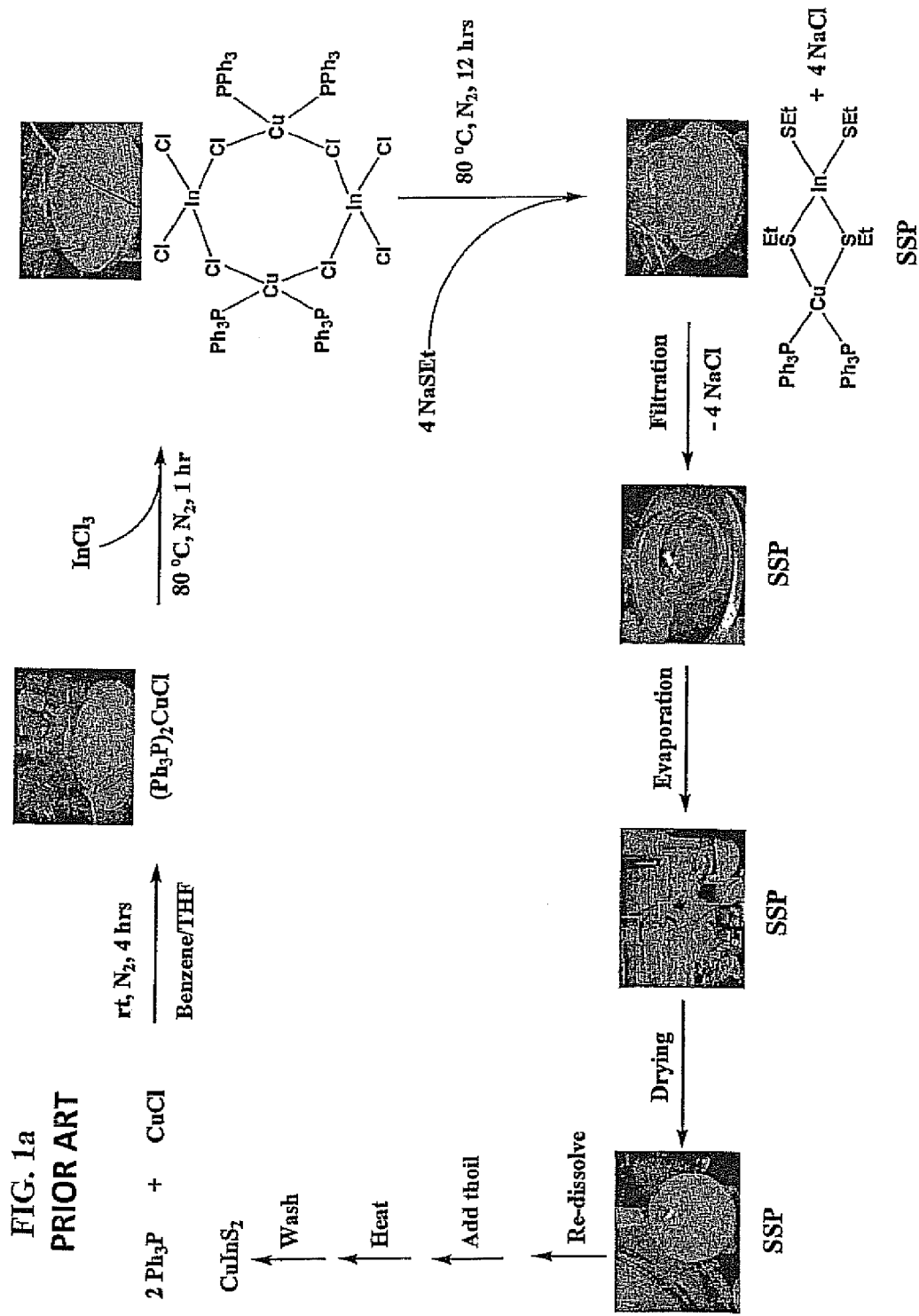
FIG. 1a generally illustrates steps in accordance with a prior art method of forming $CuInS_2$ nanoparticles.

Methods are disclosed of forming particles from single source precursors or from pre-copolymers of single source precursors in the preset of heat transfer agent, methods of forming semiconductor materials from such particles, and methods of forming semiconductor devices that include such semiconductor materials disposed between a conductor and an insulator.

The semiconductor devices include, for example, thin-film solar cells, sensors, filters and detectors of electromagnetic radiation or nuclear radiation.

Various I-III-VI$_2$ (i.e. $CuIn_xGa_{1-x}S_ySe_{2-y}$, where $0 \leq x$ and $y \leq 1$) semiconductor materials have been identified as promising photovoltaic materials. (a) J. F. Guillemoles, L. Kronik, D. Cahen, U. Rau, A. Jasenek, and H. W. Schock, *J. Phys. Chem. B*, 2000, 104, 4849; (b) A. Rockett, and R. W. Birkmire, *J. Appl. Phys.*, 1991, 70, R81. Devices containing $CuIn_xGa_{1-x}Se_2$ thin films, also known as CIGS, have already shown superior efficiency over the single crystalline silicon devices. (a) K. Ramanathan, M. A. Contreras, C. L. Perkins, S. Asher, F. S. Hasoon, J. Keane, D. Young, M. Romero, W. Metzger, R. Noufi, J. Ward, and A. Duda, *Progress in Photovoltaics,* 2003, 11, 225; (b) V. Probst, J. Palm, S. Visbeck, T. Niesen, R. Toelle, A. Lerchenberger, M. Wendl, H. Vogt, H. Calwer, W. Stetter, and F. Karg, *Solar Energy Materials and Solar Cells,* 2006, 90, 3115; (c) D. Hariskos, S. Spiering, and M. Powalla, *Thin Solid Films,* 2005, 480-481, 99. Recently, quantum dot (QD) based solar cells have attracted much attention due to their potential to replace thin film devices. (a) G. Wei, and S. R. Forrest, *Nano Letters,* 2007, 7, 218; (b) R. D. Schaller, and V. I. Klimov, *Phys. Rev. Lett.,* 2004, 92, 186601; (c) N. G. Anderson, *J. Appl. Phys.,* 1995, 78, 1850. One of the major advantages of employing QDs is by simply changing the particle size they can be tuned to absorb specific wavelengths ranging from visible to infrared wavelengths. For $CuInS_2$ QDs, the Wannier-Mott bulk exciton radius is approximately 8 nm with a bandgap of 1.45 eV and QDs with radii smaller than 8 nm exhibit bandgaps greater than 1.45 eV. Furthermore, with careful design of photovoltaic (PV) devices incorporating various sizes of nanoparticles in multiple layers, one may achieve increased solar energy absorption in one device. (a) A. Kongkanand, K. Tvrdy, K. Takechi, M. Kuno, and P. V. Kamat, *J. Am. Chem. Soc.,* 2008, 130, 4007. (b) N. C. Swe, O. Tangmattajittakul, S. Suraprapapich, P. Changmoang, S. Thainoi, C. Wissawinthanon, S. Kanjanachuchai, S. Ratanathammaphan, and S. Panyakeow, *J. Vac. Sci. Technol. B,* 2008, 26, 1100. In order to facilitate QD based multilayer devices, synthetic strategies that can deliver QDs in high yields with precise size control are essential. One of the strategies to prepare QDs is to prepare nanoparticles from molecular single source precursors (SSPs), which contain all necessary elements in a single molecule. In recent years, there have been several reports on the formation of $CuInS_2$ nanoparticles through the decomposition of SSPs using thermolysis, (a) S. L. Castro, S. G. Bailey, R. P. Raffaelle, K. K. Banger, and A. F. Hepp, *J. Phys. Chem. B,* 2004, 108, 12429; (b) S. L. Castro, S. G. Bailey, R. P. Raffaelle, K. K. Banger, and A. F. Hepp, *Chem. Mater.,* 2003, 15, 3142; (c) K. K. Banger, M. H. C. Jin, J. D. Harris, P. E. Fanwick, and A. F. Hepp, *Inorg. Chew.,* 2003, 42, 7713. (a) S. Han, M. Kong, Y. Guo, and M. Wang, *Mater. Lett.,* 2009, 63, 1192; (b) H. Zhong, Y. Zhou, M. Ye, Y. He, J. Ye, C. He, C. Yang, and Y. Li, *Chem. Mater.,* 2008, 20, 6434; (c) D. P. Dutta, and G. Sharma, *Mater. Lett.,* 2006, 60, 2395. photolysis, J. J. Nairn, P. J. Shapiro, B. Twamley, T. Pounds, R. von Wandruszka, T. R. Fletcher, M. Williams, C. Wang, and M. G. Norton, *Nano Lett.,* 2006, 6, 1218. and microwave irradiation. (a) J. S. Gardner, E. Shurdha, C. Wang, L. D. Lau, R. G. Rodriguez, and J. J. Pak, *J. Nanopart. Res.,* 2008, 10, 633. (b) C. Sun, R. D. Westover, G. Long, C. Bajracharya, J. D. Harris, A. Punnoose, R. G. Rodriguez, J. J. Pak, *International Journal of Chemical Engineering,* 2011, 2011, 545234. (c) C. Sun, J. S. Gardner, G. Long, C. Bajracharya, A. Thurber, A. Punnoose, R. G. Rodriguez, J. J. Pak, *Chem. Mater.,* 2010, 22 (9), 2699-2701. (d) C. Sun, J. S. Gardner, E. Shurdha, R. K. Margulieux, R. D. Westover, L. Lau, G. Long, C. Bajracharya, C. Wang, A. Thurber, A. Punnoose, R. G. Rodriguez, J. J. Pak, J Nanomater., 2009, 2009, 748567. Each SSP molecule contains the requisite elements to form $CuInS_2$ semiconductor materials, offering a unique level of control over product stoichiometry during the decomposition process. However, many of these procedures require combination of long reaction times of 10 to 24 hours (excluding the reaction time for preparation of SSPs) and high reaction temperatures often exceeding 200° C. Pak et al., recently developed an effective approach that affords $(Ph_3P)_2Cu\text{-}(\mu\text{-}SEt)_2In(SEt)_2$ in 94% yield on a 500 g scale. C. Sun, R. K. Margulieux, L. N. Zakharov, A. W. Holland, J. J. Pak, Inorg Chem., 2010, 49(9), 3959-3961. Pak et al., also synthesized high yield Chalcopyrite $CuInS_2$ nanoparticles by decomposing SSPs via microwave irradiation in the presence of 1,2-ethanedithiol at reaction temperatures as low as 100° C. with reaction times as short as 30 min. (a) J. S. Gardner, E. Shurdha, C. Wang, L. D. Lau, R. G. Rodriguez, and J. J. Pak, *J Nanopart. Res.*, 2008, 10, 633. (b) C. Sun, R. D. Westover, G. Long, C. Bajracharya, J. D. Harris, A. Punnoose, R. G. Rodriguez, J. J. Pak, *International Journal of Chemical Engineering*, 2011, 2011, 545234, (c) C. Sun, J. S. Gardner, G. Long, C. Bajracharya, A. Thurber, A. Punnoose, R. G. Rodriguez, J. J. Pak, *Chem. Mater.*, 2010, 22 (9), 2699-2701. (d) C. Sun, J. S. Gardner, E. Shurdha, R. K. Margulieux, R. D. Westover, L. Lau, G. Long, C. Bajracharya, C. Wang, A. Thurber, A. Punnoose, R. G. Rodriguez, J. J. Pak, J Nanomater., 2009, 2009, 748567. However, this procedure requires filtration or separation of by-product (NaCl), evaporation of solvents, and re-dissolve of SSP for further reactions. The SSPs can be exposed to air by these multi-steps.

As used herein, the terms "single source precursor" and "SSP" mean and include any substance (e.g., a molecule or complex) that comprises all of the necessary atomic elements, in the appropriate stoichiometric ratios, necessary to form a chalcogenide material (e.g., a ternary chalcopyrite material). Single source precursors may comprise so-called organometallic substances. As non-limiting examples, single source precursors include molecules or complexes having the empirical formula $[L_2N(\mu\text{-}ER)_2M(ER)_2]$ (or $L_2NM(ER)_4$), wherein L is a Lewis base that is coordinated to N by a dative bond, each N is individually selected from Group IB atoms, each M is individually selected from Group IIIA atoms, each E is individually selected from Group VIA atoms, and each R is individually selected from the group consisting of alkyl, aryl, vinyl, (per)fluoro alkyl, (per)fluoro aryl, silane, and carbamato groups. As six particular non-limiting examples, single source precursors include $(Ph_3P)_2Cu(\mu\text{-}SEt)_2In(SEt)_2$, $(Ph_3P)_2Cu(\mu\text{-}SEt)_2Ga(SEt)_2$, $(Ph_3P)_2Cu(\mu\text{-}SEt)_2Al(SEt)_2$, $(Ph_3P)_2Ag(\mu\text{-}SEt)_2In(SEt)_2$, $(Ph_3P)_2Ag(\mu\text{-}SEt)_2Ga(SEt)_2$, and $(Ph_3P)_2Ag(\mu\text{-}SEt)_2Al(SEt)_2$.

The growth of nanomaterials is dependent on the thermodynamic and kinetic barriers in the reaction as defined by the reaction trajectory and influenced by vacancies, defects, and surface reconstruction events. For the most part, the synthetic methods utilize conventional convective heating due to the need for high-temperature initiated nucleation followed by controlled precursor addition to the reaction. Conventional thermal techniques rely on conduction of blackbody radiation to drive the reaction. The reaction vessel acts as an intermediary for energy transfer from the heating mantle to the solvent and finally to the reactant molecules. This can cause sharp thermal gradients throughout the bulk solution and inefficient, nonuniform reaction conditions. This is a common problem encountered in chemical scale-up and is made more problematic in nanomaterials where uniform nucleation and growth rates are critical to material quality. Seeking to overcome the slightly air sensitive SSPs, it was discovered that reacting of SSPs containing NaCl, as by-product, can provide desired products without sacrificing yield and expose SSPs to air. It was also discovered that NaCl acts as an intermediary for energy transfer from the heating mantle to the solvent and finally to the reactant molecules. The invention comprises the one-pot synthesis of Chalcopyrite $CuInS_2$ nanoparticles by decomposition of SSPs in the presence of 3-mercaptopropanic acid via conventional convective heating method. The advantage of this reaction can be seen in the simplicity of the straightforward reaction and low-cost preparation of CIS nanoparticles.

As used herein, the term "I-III-$VI_2$ material" means and includes any compound generally represented by the formula wherein I represents an element in Group I (Groups IA (1) and IB (11)) of the periodic table; wherein III refers to an element in Group III (Groups IIIB (3) and IIIA (13)) of the periodic table; and wherein VI refers to an element in Group VI (Groups VIB (6) and VIA (16)) of the periodic table. For example, the material may be generally have the formula $(Cu, Ag)(Al, Ga, In, Tl, Fe)(S, Se, Te)_2$. For example, approximately twenty-five percent (25%) of the atoms in a ternary chalcopyrite material may be from Group IB, approximately twenty-five percent (25%) of the atoms may be from Group IIIA, and approximately fifty percent (50%) of the atoms may be from Group VIA. $CuInS_2$, $CuInSe_2$, $CuIn_xGa_{(1-x)}Se_2$, $CuGaSe_2$, $CuIn_xGa_{(1-x)}S_2$, $CuFeS_2$, $AgGaS_2$, $AgGaSe_2$, and $AgInS_2$ are examples of I-III-$VI_2$ compounds. It should be noted that compounds include compounds having multiple and/or different atoms from each of three Groups of the periodic table. For example, the I-III-$VI_2$ compound CuInSSe includes Cu (Group IB), In (Group IIIA), and S and Se (both from Group VIA). In addition, materials of the form (Cu:Ag)(In:Ga)(S:Se), having various ratios of the respectively grouped atoms are all I-III-$VI_2$ compounds (Cu and Ag are both in Group IB, In and Ga both are in Group IIIA, S and Se are both in Group VIA).

As used herein, the term "chalcopyrite phase" means and includes a state in which a material exhibits a crystal lattice structure that includes a tetrahedrally coordinated, ordered structure.

Embodiments of the present invention include methods of forming I-III-$VI_2$ particles in the chalcopyrite phase and are believed to generally reduce reaction times, reduce reaction temperatures, enable the use of many forms of single source precursors and/or pre-(co)polymer of single source precursors, and provide good reproducibility, greener approaches, and high yields relative to other methods known in the art.

A reaction mixture including the single source precursors may be in the solvent, such as benzyl acetate, and sodium chloride may be suspended in the benzyl acetate, the thiol may be provided within another form of container. The thiol may then be added to the solution comprising the single source precursors dissolved in the solvent and sodium chloride suspended in the solvent to form the reaction mixture. The solvent is selected to have a boiling point higher than any temperature to which the solvent is expected to be exposed prior to the creation of the nanoparticles.

Within the reaction mixture may be heated to a temperature of between less than about 300° C. and within the range of 100°-300° C. and, more preferably, between about 120° C. and about 200° C.

As the reaction mixture is heated, in the presence of the salt, which may act as a heat transfer. In embodiments where the salt comprises a halogen, such as sodium chloride (NaCl).

As the reaction mixture is heated, the single source precursors decompose in the presence of the thiol, which may act as a stabilizing ligand. In embodiments where the thiol comprises a thiol acid, such as 3-mercaptopropionic acid, the thiol acid together with metal ions from the single source precursor may complex on surfaces of the single source precursors.

The reaction mixture may be heated, for example, for between about 30 minutes and about 6 hours and, more particularly, for about 2 hour.

During formation of the I-II-$VI_2$ particles, the temperature and reaction time to which the reaction mixture is heated may be controlled to form a desired chalcopyrite particles size.

An amount of the thiol added to the reaction mixture may also be controlled to form the desired chalcopyrite particles size.

By way of example and not limitation, the following are examples of thiols that may be used in the preparation of the I-III-$VI_2$ particles: 3-mercaptopropionic acid, 1,2- ethanedithiol, 1,1-methanedithiol, 3-mercaptobenzoic, phenyl-1,2-ethanedithiol, thiophenol, thiosalicylic acid, 1,3-propanedithiol, 2,2-propanedithiol, 1,2-propanedithiol, 2,2-dimethyl-1,3-propanedithiol, 1,3-diphenyl-2,2-propanedithiol, 1,4-butanedithiol, 2,3-butanedithiol, 2,2-butanedithiol, 1,3-isobutanedithiol, 1,5-pentanedithiol, 1,6-hexanedithiol, and 1,2-hexanedithiol.

By way of example and not limitation, the following are examples of heat transfer agents that may be used in the preparation of the I-III-VI$_2$ particles: NaCl, NaBr, NaF, NaI, KCl, KBr, KF, KI, LiCl, LiBr, LiF, and LiI.

By way of example and not limitation, the following are examples of element in Group IB (11) of the periodic table that may be used in the preparation of the I-III-VI$_2$ particles: CuCl, CuI, CuF, CuBr, AgCl, AgI, AgF, and AgBr.

By way of example and not limitation, the following are examples of element in Group IIIA (13) of the periodic table that may be used in the preparation of the I-III-VI$_2$ particles: InCl$_3$, InBr$_3$, InF$_3$, InI$_3$, GaCl$_3$, GaBr$_3$, GaF$_3$, GaI$_3$, AlCl$_3$, AlBr$_3$, AlF$_3$, and AlI$_3$.

By way of example and not limitation, the following are examples of copper-indium SSPs:
[bis(ethanethiolato)indium]bis[μ-(ethanethiolato)]bis(triisobutylphosphine)-copper;
[bis(ethanethiolato)indium]bis[μ-(ethanethiolato)]bis(trihexylphosphine)-copper;
[bis(ethanethiolato)indium]bis[μ-(ethanethiolato)]bis(triphenylphosphine)-copper;
[bis(ethanethiolato)indium]bis[μ-(ethanethiolato)]bis(perfluorotriphenylphosphine)-copper;
[bis(propanethiolato)indium]bis[μ-(propanethiolato)]bis(triisobutylphosphine)-copper;
[bis(propanethiolato)indium]bis[μ-(propanethiolato)]bis(trihexylphosphine)-copper;
[bis(propanethiolato)indium]bis[μ-(propanethiolato)]bis(triphenylphosphine)-copper;
[bis(propanethiolato)indium]bis[μ-(propanethiolato)]bis(perfluorotriphenylphosphine)-copper;
[bis(hexanethiolato)indium]bis[μ-(propanethiolato)]bis(triisobutylphosphine)-copper;
[bis(hexanethiolato)indium]bis[μ-(propanethiolato)]bis(trihexylphosphine)-copper;
[bis(hexanethiolato)indium]bis[μ-(propanethiolato)]bis(triphenylphosphine)-copper;
[bis(hexanethiolato)indium]bis[μ-(propanethiolato)]bis(perfluorotriphenylphosphine)-copper;
[bis(4-trifluoromethyl-thiophenolato)indium]bis[μ-(4-trifluoromethylthiophenolato)]bis(triisobutylphosphine)-copper;
[bis(4-trifluoromethyl-thiophenolato)indium]bis[μ-(4-trifluoromethyl-thiophenolato)]bis(trihexylphosphine)-copper;
[bis(4-trifluoromethyl-thiophenolato)indium]bis[μ-(4-trifluoromethyl-thiophenolato)]bis(triphenylphosphine)-copper;
[bis(4-trifluoromethyl-thiophenolato)indium]bis[μ-(4-trifluoromethyl-thiophenolato)]bis(perfluorotriphenylphosphine)-copper;
[bis(3,5-bis(trifluoromethyl)-thiophenolato)indium]bis[μ-(3,5-bis(trifluoromethyl)-thiophenolato)]bis(triisobutylphosphine)-copper;
[bis(3,5-bis(trifluoromethyl)-thiophenolato)indium]bis[μ-(3,5-bis(trifluoromethyl)-thiophenolato)]bis(trihexylphosphine)-copper;
[bis(3,5-bis(trifluoromethyl)-thiophenolato)indium]bis[μ-(3,5-bis(trifluoromethyl)-thiophenolato)]bis(triphenylphosphine)-copper;
[bis(3,5-bis(trifluoromethyl)-thiophenolato)indium]bis[μ-(3,5-bis(trifluoromethyl)-thiophenolato)]bis(perfluorotriphenylphosphine)-copper;
[bis(thiophenolato)indium]bis[μ-(thiophenolato)]bis(triisobutylphosphine)-copper;
[bis(thiophenolato)indium]bis[μ-(thiophenolato)]bis(trihexylphosphine)-copper;
[bis(thiophenolato)indium]bis[μ-(thiophenolato)]bis(triphenylphosphine)-copper;
[bis(thiophenolato)indium]bis[μ-(thiophenolato)]bis(perfluorotriphenylphosphine)-copper;
[bis(α-toluenethiolato)indium]bis[μ-(α-toluenethiolato)]bis(triisobutylphosphine)-copper;
[bis(α-toluenethiolato)indium]bis[μ-(α-toluenethiolato)]bis(trihexylphosphine)-copper;
[bis(α-toluenethiolato)indium]bis[μ-(α-toluenethiolato)]bis(triphenylphosphine)-copper;
[bis(α-toluenethiolato)indium]bis[μ-(α-toluenethiolato)]bis(perfluorotriphenylphosphine)-copper;
[bis(pentafluorothiophenolato)indium]bis[μ-(pentafluorothiophenolato)]bis(triisobutylphosphine)-copper;
[bis(pentafluorothiophenolato)indium]bis[μ-(pentafluorothiophenolato)]bis(trihexylphosphine)-copper;
[bis(pentafluorothiophenolato)indium]bis[μ-(pentafluorothiophenolato)]bis(triphenylphosphine)-copper;
[bis(pentafluorothiophenolato)indium]bis[μ-(pentafluorothiophenolato)]bis(perfluorotriphenylphosphine)-copper;
[bis(thiobenzoato)indium]bis[μ-(thiobenzoato)]bis(triisobutylphosphine)-copper;
[bis(thiobenzoato)indium]bis[μ-(thiobenzoato)]bis(trihexylphosphine)-copper;
[bis(thiobenzoato)indium]bis[μ-(thiobenzoato)]bis(triphenylphosphine)-copper;
[bis(thiobenzoato)indium]bis[μ-(thiobenzoato)]bis(perfluorotriphenylphosphine)-copper;
[bis(thiobenzoato)indium]bis[μ-(thiobenzoato)]bis[ethylenebis(diphenylphosphine)]-copper;
[bis(thiobenzoato)indium]bis[μ-(thiobenzoato)]bis[bis(2-diphenylphosphinophenyl)ether]-copper;
[bis(thiobenzoato)indium]bis[μ-(thiobenzoato)]bis(trimethylphosphine)-copper;
[bis(ethanethiolato)indium]bis[μ-(ethanethiolato)]bis[ethylenebis(diphenylphosphine)]-copper;
[bis(ethanethiolato)indium]bis[μ-(ethanethiolato)]bis[bis(2-diphenylphosphinophenyl)ether]-copper;
[bis(ethanethiolato)indium]bis[μ-(thiophenolato)]bis(triphenylphosphine)-copper; and
[bis(ethanethiolato)indium]bis[μ-(ethanethiolato)]bis(trimethylphosphine)-copper.

By way of example and not limitation, the following are examples of copper-gallium SSPs:
[bis(ethanethiolato)Gallium]bis[μ-(ethanethiolato)]bis(triisobutylphosphine)-copper;
[bis(ethanethiolato)Gallium]bis[μ-(ethanethiolato)]bis(trihexylphosphine)-copper;
[bis(ethanethiolato)Gallium]bis[μ-(ethanethiolato)]bis(triphenylphosphine)-copper;
[bis(ethanethiolato)Gallium]bis[μ-(ethanethiolato)]bis(perfluorotriphenylphosphine)-copper;
[bis(propanethiolato)Gallium]bis[μ-(propanethiolato)]bis(triisobutylphosphine)-copper;
[bis(propanethiolato)Gallium]bis[μ-(propanethiolato)]bis(trihexylphosphine)-copper;
[bis(propanethiolato)Gallium]bis[μ-(propanethiolato)]bis(triphenylphosphine)-copper;

[bis(propanethiolato)Gallium]bis[μ-(propanethiolato)]bis(perfluorotriphenylphosphine)-copper;
[bis(hexanethiolato)Gallium]bis[μ-(propanethiolato)]bis(triisobutylphosphine)-copper;
[bis(hexanethiolato)Gallium]bis[μ-(propanethiolato)]bis(trihexylphosphine)-copper;
[bis(hexanethiolato)Gallium]bis[μ-(propanethiolato)]bis(triphenylphosphine)-copper;
[bis(hexanethiolato)Gallium]bis[μ-(propanethiolato)]bis(perfluorotriphenylphosphine)-copper;
[bis(4-trifluoromethyl-thiaphenolato)Gallium]bis[μ-(4-trifluoromethyl-thiophenolato)]bis(triisobutylphosphine)-copper;
[bis(4-trifluoromethyl-thiophenolato)Gallium]bis[μ-(4-trifluoromethyl-thiophenolato)]bis(trihexylphosphine)-copper;
[bis(4-trifluoromethyl-thiophenolato)Gallium]bis[μ-(4-trifluoromethyl-thiophenolato)]bis(triphenylphosphine)-copper;
[bis(4-trifluoromethyl-thiophenolato)Gallium]bis[μ-(4-trifluoromethyl-thiophenolato)]bis(perfluorotriphenylphosphine)-copper;
[bis(3,5-bis(trifluoromethyl)-thiophenolato)Gallium]bis[μ-(3,5-bis(trifluoromethyl)-thiophenolato)]bis(triisobutylphosphine)-copper;
[bis(3,5-bis(trifluoromethyl)-thiophenolato)Gallium]bis[μ-(3,5-bis(trifluoromethyl)-thiophenolato)]bis(trihexylphosphine)-copper;
[bis(3,5-bis(trifluoromethyl)-thiophenolato)Gallium]bis[μ-(3,5-bis(trifluoromethyl)-thiophenolato)]bis(triphenylphosphine)-copper;
[bis(3,5-bis(trifluoromethyl)-thiophenolato)Gallium]bis[μ-(3,5-bis(trifluoromethyl)-thiophenolato)]bis(perfluorotriphenylphosphine)-copper;
[bis(thiophenolato)gallium]bis[μ-(thiophenolato)]bis(triisobutylphosphine)-copper;
[bis(thiophenolato)gallium]bis[μ-(thiophenolato)]bis(trihexylphosphine)-copper;
[bis(thiophenolato)gallium]bis[μ-(thiophenolato)]bis(triphenylphosphine)-copper;
[bis(thiophenolato)gallium]bis[μ-(thiophenolato)]bis(perfluorotriphenylphosphine)-copper;
[bis(α-toluenethiolato)gallium]bis[μ-(α-toluenethiolato)]bis(triisobutylphosphine)-copper;
[bis(α-toluenethiolato)gallium]bis[μ-(α-toluenethiolato)]bis(trihexylphosphine)-copper;
[bis(α-toluenethiolato)gallium]bis[μ-(α-toluenethiolato)]bis(triphenylphosphine)-copper;
[bis(α-toluenethiolato)gallium]bis[μ-(α-toluenethiolato)]bis(perfluorotriphenylphosphine)-copper;
[bis(pentafluorothiophenolato)gallium]bis[μ-(pentafluorothiophenolato)]bis(triisobutylphosphine)-copper;
[bis(pentafluorothiophenolato)gallium]bis[μ-(pentafluorothiophenolato)]bis(trihexylphosphine)-copper;
[bis(pentafluorothiophenolato)gallium]bis[μ-(pentafluorothiophenolato)]bis(triphenylphosphine)-copper; and
[bis(pentafluorothiophenolato)gallium]bis[μ-(pentafluorothiophenolato)]bis(perfluorotriphenylphosphine)-copper.

By way of example and not limitation, the following are examples of silver-aluminum SSPs:
[bis(ethanethiolato)aluminum]bis[μ(ethanethiolato)]bis(triisobutylphosphine)-silver;
[bis(ethanethiolato)aluminum]bis[μ-(ethanethiolato)]bis(trihexylphosphine)-silver;
[bis(ethanethiolato)aluminum]bis[μ-(ethanethiolato)]bis(triphenylphosphine)-silver;
[bis(ethanethiolato)aluminum]bis[μ-(ethanethiolato)]bis(perfluorotriphenylphosphine)-silver;
[bis(propanethiolato)aluminum]bis[μ-(propanethiolato)]bis(triisobutylphosphine)-silver;
[bis(propanethiolato)aluminum]bis[μ-(propanethiolato)]bis(trihexylphosphine)-silver;
[bis(propanethiolato)aluminum]bis[μ-(propanethiolato)]bis(triphenylphosphine)-silver;
[bis(propanethiolato)aluminum]bis[μ-(propanethiolato)]bis(perfluorotriphenylphosphine)-silver;
[bis(hexanethiolato)aluminum]bis[μ-(propanethiolato)]bis(triisobutylphosphine)-silver;
[bis(hexanethiolato)aluminum]bis[μ-(propanethiolato)]bis(trihexylphosphine)-silver;
[bis(hexanethiolato)aluminum]bis[μ-(propanethiolato)]bis(triphenylphosphine)-silver;
[bis(hexanethiolato)aluminum]bis[μ-(propanethiolato)]bis(perfluorotriphenylphosphine)-silver;
[bis(4-trifluoromethyl-thiophenolato)aluminum]bis[μ-(4-trifluoromethylthiophenolato)]bis(triisobutylphosphine)-silver;
[bis(4-trifluoromethyl-thiophenolato)aluminum]bis[μ-(4-trifluoromethyl-thiophenolato)]bis(tri hexylphosphine)-silver;
[bis(4-trifluoromethyl-thiophenolato)aluminum]bis[μ-(4-trifluoromethyl-thiophenolato)]bis(tri phenylphosphine)-silver;
[bis(4-trifluoromethyl-thiophenolato)aluminum]bis[μ-(4-trifluoromethyl-thiophenolato)]bis(perfluorotriphenylphosphine)-silver;
[bis(3,5-bis(trifluoromethyl)-thiophenolato)aluminum]bis[μ-(3,5-bis(trifluoromethyl)-thiophenolato)]bis(triisobutylphosphine)-silver;
[bis(3,5-bis(trifluoromethyl)-thiophenolato)aluminum]bis[μ-(3,5-bis(trifluoromethyl)-thiophenolato)]bis(trihexylphosphine)-silver;
[bis(3,5-bis(trifluoromethyl)-thiophenolato)aluminum]bis[μ-(3,5-bis(trifluoromethyl)-thiophenolato)]bis(triphenylphosphine)-silver;
[bis(3,5-bis(trifluoromethyl)-thiophenolato)aluminum]bis[μ-(3,5-bis(trifluoromethyl)-thiophenolato)]bis(perfluorotriphenylphosphine)-silver;
[bis(thiophenolato)aluminum]bis[μ-(thiophenolato)]bis(triisobutylphosphine)-silver;
[bis(thiophenolato)aluminum]bis[μ-(thiophenolato)]bis(trihexylphosphine)-silver;
[bis(thiophenolato)aluminum]bis[μ-(thiophenolato)]bis(triphenylphosphine)-silver;
[bis(thiophenolato)aluminum]bis[μ-(thiophenolato)]bis(perfluorotriphenylphosphine)-silver;
[bis(α-toluenethiolato)aluminum]bis[μ-(α-toluenethiolato)]bis(triisobutylphosphine)-silver;
[bis(α-toluenethiolato)aluminum]bis[μ-(α-toluenethiolato)]bis(trihexylphosphine)-silver;
[bis(α-toluenethiolato)aluminum]bis[μ-(α-toluenethiolato)]bis(triphenylphosphine)-silver;
[bis(α-toluenethiolato)aluminum]bis[μ-(α-toluenethiolato)]bis(perfluorotriphenylphosphine)-silver;
[bis(pentafluorothiophenolato)aluminum]bis[μ-(pentafluorothiophenolato)]bis(triisobutylphosphine)-silver;
[bis(pentafluorothiophenolato)aluminum]bis[μ-(pentafluorothiophenolato)]bis(trihexylphosphine)-silver;
[bis(pentafluorothiophenolato)aluminum]bis[μ-(pentafluorothiophenolato)]bis(triphenylphosphine)-silver; and
[bis(pentafluorothiophenolato)aluminum]bis[μ-(pentafluorothiophenolato)]bis(perfluorotriphenylphosphine)-silver.

The examples of single source precursors set forth above are examples only, and those of ordinary skill in the art will understand that such examples may be used to derive many other single source precursors for use in forming other types of particles and nanoparticles using the methods described herein.

The methods described above may result in the formation of particles comprising a ternary, quaternary or multinary I-III-VI$_2$ material in the chalcopyrite phase. As known in the art, at least some ternary, quaternary or multinary I-III-VI$_2$ materials are semiconductor materials. Furthermore, in some embodiments, the particles formed from embodiments of the methods of the invention, as described herein, may comprise nanoparticles. In some embodiments, the resulting nanoparticles may have an average particle size (e.g., an average diameter) of less than or equal to 20 nm. In some embodiments, the nanoparticles may even have an average particle size of about 10 nm or less.

One set of materials used to practice the method included Triphenylphosphine (Ph$_3$P, 99+%), indium (III) chloride (InCl$_3$, anhydrous 99.999%, metals basis), copper (I) chloride (CuCl, anhydrous, 99.999%, metals basis), and benzyl acetate (C$_6$H$_5$CH$_2$CO$_2$CH$_3$, 99%) were purchased from Alfa Aesar. Ethanethiol (CH$_3$CH$_2$SH, 99+%) and 3-mercaptopropionic acid (HSCH$_2$CH$_2$CO$_2$H, 99+%) were purchased from Acros Organics. Ethyl ether ((CH$_3$CH$_2$)$_2$O, anhydrous, BHT stabilized/certified ACS) was purchased from Fisher Scientific. All other reagents were obtained from commercial sources and used without further purification. Unless stated otherwise, all reactions were performed in a fume hood, under inert conditions (dry nitrogen atmosphere) obtained by implementation of standard Schlenk techniques. Sodium ethanethiolate was prepared by refluxing ethanethiol over sodium metal in a suspension of diethyl ether for overnight.

Embodiments of the present invention include methods of forming layers of semiconductor materials that include a I-III-VI$_2$ material in the chalcopyrite phase. The methods are believed to generally minimize defects, fabrication costs, and to exhibit improved efficiency relative to other methods known in the art.

Referring to FIG. 1a, a prior art method in forming particles, such as CuInS$_2$, includes adding two (2) molar equivalents of Ph$_3$P (triphenylphosphine) may be added to a mixture of one hundred (100) milliliters (mL) of anhydrous benzene (C$_6$H$_6$) and one hundred (100) milliliters (mL) of anhydrous tetrahydrofuran ((CH$_2$)$_4$O, THF) to form a solution; one (1) molar equivalent of anhydrous CuCl (copper (I) chloride) may be added to the stirring solution; one (1) molar equivalent of anhydrous InCl$_3$ (indium (III) chloride) may be added; four (4) molar equivalents of precurstor forming material NaSEt (sodium ethanethiolate) may be added. After stirring and formation of SSP and NaCl, the SSP and NaCl may be separated. The SSP may be evaporated from a mixture of solvents (i.e. Benzene and THF). The SSP is dried under vacuum pump overnight. The SSP is re-dissolved in high boiling point of solvent and added thiol. I need your help to add more on these steps.

Figure 1B:
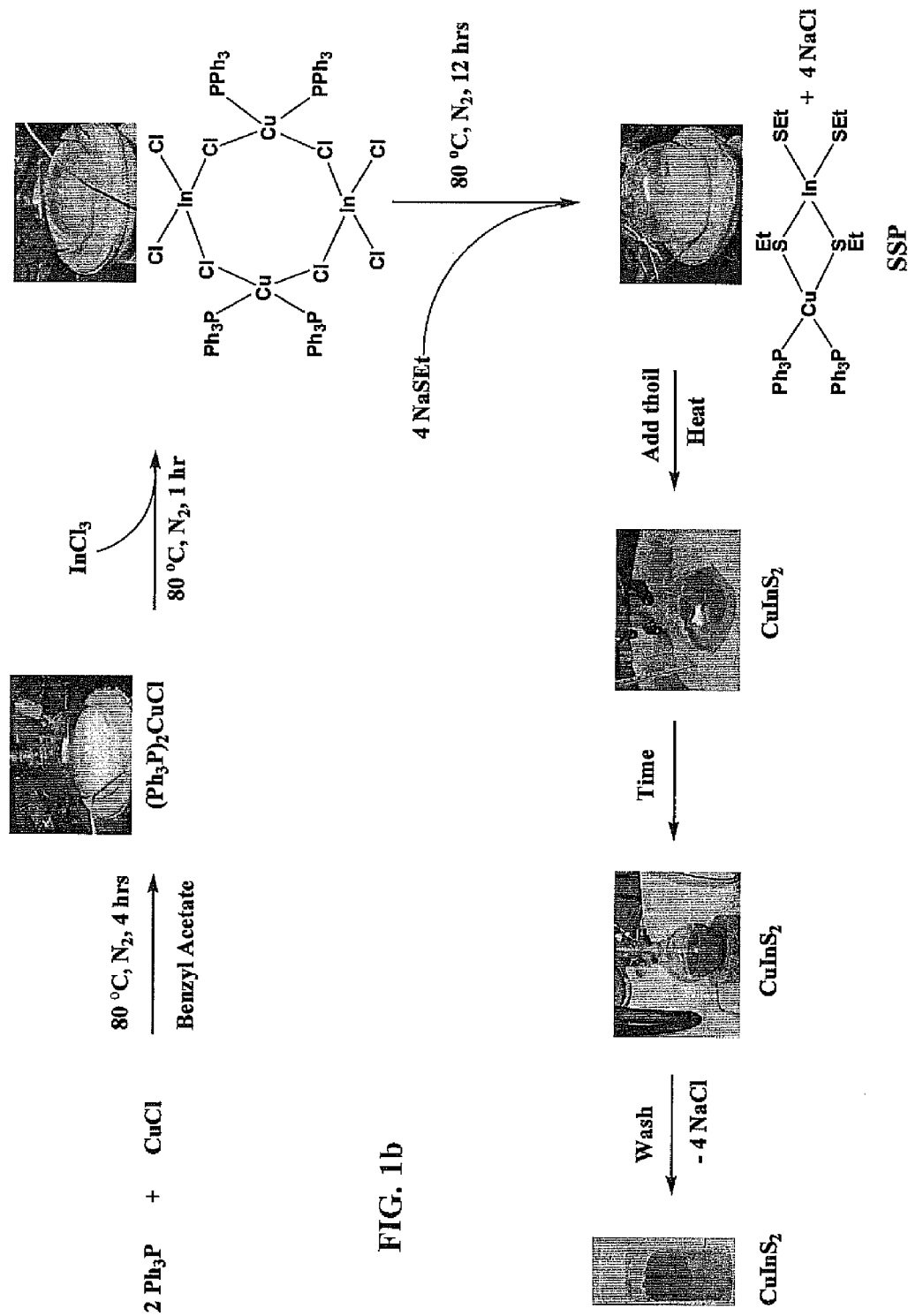
FIG. 1b is similar to FIG. 1a but generally illustrates the steps of the method in accordance with the invention.

Referring to FIG. 1b, a method in forming I-III-VI$_2$ particles, such as CuInS$_2$, includes adding two (2) molar equivalents of Ph$_3$P (triphenylphosphine) may be added to one hundred (100) milliliters (mL) of benzyl acetate to form a solution; one (1) molar equivalent of anhydrous CuCl (copper (I) chloride) may be added to the stirring solution; one (1) molar equivalent of anhydrous InCl$_3$ (indium (III) chloride) may be added; four (4) molar equivalents of precurstor forming material NaSEt (sodium ethanethiolate) may be added; and followed by addition of 3-mercaptopropionic acid to form a reaction mixture. The precursor forming material may be selected from the group essentially consisting of NaSEt, KSEt and LiSEt. The reaction mixture may be exposed to heat and may be maintained at temperatures in a range of from about 150° C. to about 200° C. for about 2 hour to form CuInS$_2$ particles in the chalcopyrite phase (i.e., CuInS$_2$ chalcopyrite particles). As previously indicated, reaction temperature, reaction time and concentration of single source precursors and a thiol concentration may be controlled to form a desired size of the CuInS$_2$ chalcopyrite particles.

In embodiments in which the particles comprise CuGaS$_2$, two (2) molar equivalents of Ph$_3$P (triphenylphosphine) may be added to one hundred (100) milliliters (mL) of benzyl acetate to form a solution; one (1) molar equivalent of anhydrous CuCl (copper (I) chloride) may be added to the stirring solution; one (1) molar equivalent of anhydrous GaCl$_3$ (gallium (III) chloride) may be added; four (4) molar equivalents of NaSEt (sodium ethanethiolate) may be added; and followed by addition of 3-mercaptopropionic acid to form a reaction mixture. The reaction mixture may be exposed to heat and may be maintained at temperatures in a range of from about 150° C. to about 200° C. for about 2 hour to form the CuGaS$_2$ particles in the chalcopyrite phase (i.e., CuGaS$_2$ chalcopyrite particles). As previously indicated, reaction temperature, reaction time and concentration of single source precursors and a thiol concentration may be controlled to form a desired size of the CuGaS$_2$ chalcopyrite particles.

In embodiments in which the I-III-VI$_2$ particles comprise CuIn$_x$Ga$_{1-x}$S$_2$, four (4) molar equivalents of Ph$_3$P may be added to one hundred (100) milliliters (mL) of benzyl acetate to form a solution; two (2) molar equivalent of anhydrous Cu(I)Cl may be added to the stirring solution; one (1) molar equivalent of anhydrous InCl$_3$ may be added; one (1) molar equivalent of anhydrous GaCl$_3$ may be added; eight (8) molar equivalents of NaSEt may be added; and followed by addition of 3-mercaptopropionic acid to form a reaction mixture. The reaction mixture may be exposed to heat and may be maintained at temperatures in a range of from about 150° C. to about 200° C. for about 2 hours to form the CuIn$_x$Ga$_{1-x}$S$_2$ particles in the chalcopyrite phase (i.e., CuIn$_x$Ga$_{1-x}$S$_2$ chalcopyrite particles). As previously indicated, reaction temperature, reaction time and concentration of single source precursors and a thiol concentration may be controlled to form a desired size of the CuIn$_x$Ga$_{1-x}$S$_2$ chalcopyrite particles.

In embodiments in which the I-III-VI$_2$ particles comprise CuIn$_x$Ga$_{1-x}$S$_2$, two (2) molar equivalents of Ph$_3$P may be added to one hundred (100) milliliters (mL) of benzyl acetate to form a solution; one (1) molar equivalent of anhydrous Cu(I)Cl may be added to the stirring solution; one (1) molar equivalent of anhydrous InCl$_3$ may be added and/or one (1) molar equivalent of anhydrous GaCl$_3$ may be added; four (4) molar equivalents of NaSEt may be added; and followed by addition of 1,2-ethanedithiol to form a reaction mixture. The reaction mixture may be exposed to heat and may be maintained at temperatures in a range of from about 150° C. to about 200° C. for about 2 hour to form the CuIn$_x$Ga$_{1-x}$S$_2$ particles in the chalcopyrite phase (i.e., CuIn$_x$Ga$_{1-x}$S$_2$ chalcopyrite particles). As previously indicated, reaction temperature, reaction time and concentration of single source precursors and thiol concentration may be controlled to form a desired size of the CuIn$_x$Ga$_{1-x}$S$_2$ chalcopyrite particles.

In embodiments in which the I-III-VI$_2$ particles comprise CuInS$_y$Se$_{2-y}$, two (2) molar equivalents of Ph$_3$P may be added to fifty (50) milliliters (mL) of benzyl acetate to form a solution; one (1) molar equivalent of anhydrous Cu(I)Cl may be added to the stirring solution; one (1) molar equivalent of anhydrous InCl$_3$ may be added; four (4) molar equivalents of NaSEt may be added; one (1) molar equivalents of PhSeH (phenylselenol) may be added; and followed by addition of 3-mercaptopropionic acid to form a reaction mixture. The reaction mixture may be exposed to heat and may be maintained at temperatures in a range of from about 150° C. to about 200° C. for about 2 hour to form the CuInS$_y$Se$_{2-y}$ particles in the chalcopyrite phase (i.e., CuInS$_y$Se$_{2-y}$ chalcopyrite particles). As previously indicated, reaction temperature, reaction time and concentration of single source precursors and thiol concentration may be controlled to form a desired size of the CuInS$_y$Se$_{2-y}$ chalcopyrite particles.

Molecular Single Source Precursor (SSP) was synthesized according to the modifications of the literature procedures. C. Sun, R. K. Margulieux, L. N. Zakharov, A. W. Holland, J. J. Pak, Inorg Chem., 2010, 49(9), 3959-3961. Only benzyl acetate was used as a solvent. Ph$_3$P (10.00 g, 38.13 mmol, 2 equiv) was added to 100 mL or 50 mL of benzyl acetate and CuCl (1.885 g, 19.06 mmol, 1 equiv) was added to the stirring solution and heated for about 4 hrs at 80° C. to form a white suspension including the intermediate product (Ph$_3$P)$_2$Cu—Cl. Anhydrous InCl$_3$ (4.22 g, 19.06 mmol, 1 equiv) was added, after which this solution was stirred for about 60 min at 80° C. NaSEt (7.000 g, 83.21 mmol, 4.366 equiv) was added to this solution and stirred for an additional overnight at 80° C. At this point, there was no filtration or separation of sodium chloride as by-product and there was no evaporation of the solvent.

In accordance with the prior art method shown in FIG. 1a the single source precursor solution containing the NaCl salt was filtered to remove the NaCl, and the single source precursor and a mixture of benzene and THF solvents solution was then heated to evaporate the solvents leaving the single source precursor. The single source precursor was then further dried to remove any remaining solvents and leave a dry powder form of the single source precursor. A higher boiling point of solvent was used to re-dissolve the single source precursor and a thiol was then added to the mixture of single source precursor and solvent. The resulting solution was then heated to form CuInS$_2$ nanoparticles. The reaction temperature, reaction time and concentration of the single source precursor in this reaction determined the size of the nanoparticles.

Referring to FIG. 1b an important feature of the invention is that the salt NaCl is retained in solution with the single source precursor and a thiol is added to the solution after which the solution is heated in a single pot. The single pot reaction, in the presence of NaCl, minimizes exposure of the air-sensitive single source precursor to the atmosphere and provides a more uniform heat distribution. This allows the reaction to take place at a lower temperature, preferably a substantially constant temperature, and provides greater options in controlling the sizes of the nanoparticles by selecting the temperature, process times and concentrations. With the method of the invention only when the CuInS$_2$ particles achieve a desired size are the particles washed to remove the NaCl to leave the desired CuInS$_2$ nanoparticles.

Comparing FIGS. 1a and 1b, it is clear that the subject invention eliminates a number of process steps, including the filtration, evaporation and drying steps shown in FIG. 1a to obtain a single source precursor without the salt, NaCl. Importantly, in the prior art method a number of steps are taken to eliminate the salt before the single source precursor is re-dissolved in solution with higher boiling point solvent and a thiol. While in the present method the thiol is added to the single source precursor and a stable salt solution so that the solution can be heated and remains stable at the operating temperatures and the process carried out in the presence of the salt. The salt is only removed at the end of the single pot reaction after the nanoparticles have attained their desired sizes, generally over shorter periods of time and at lower temperatures. This increases the efficiency of the process and the yield, avoiding the need to consume additional energy, materials and chemicals to perform the additional filtration, evaporation, drying and re-dissolving steps as well as the need to use more costly solvents.

In a typical reaction for the synthesis of CuInS$_2$ (CIS) nanocrystals with the Chalcopyrite structure is 4 simple steps reaction. 1) 2 molar equivalents of Ph$_3$P (triphenylphosphine) and 1 molar equivalent of anhydrous Cu(I)Cl (copper (I) chloride) were mixed with 100 mL or 50 mL of benzyl acetate in either one or two neck round-bottom flask and stirred at 80° C. for 4 hrs with nitrogen purging. 2) 1 molar equivalent of anhydrous InCl$_3$ (indium (III) chloride) was added at 80° C. and stirring continued for 1 hr with nitrogen purging. The solution turned essentially clear with a light yellow color. 3) 4 molar equivalents of NaSEt (sodium ethanethiolate) was added and stirred for overnight at 80° C. with nitrogen purging. 4) 3-mercaptopropionic acid was added. The reaction mixture was heated achieving reaction temperatures from 150° C. to 190° C. as desired for about 3 hrs with nitrogen purging. Upon completion, the reaction was cooled to room temperature to yield precipitation of CuInS$_2$ nanoparticles. The resulting nanoparticles were isolated from the benzyl acetate solution by centrifugation, collected, and washed one time with CH$_3$OH, two times with 75:25 (v/v) mixtures of CH$_3$OH and H$_2$O, and two more time with CH$_3$OH. The product was then dried in vacuo to provide yellow to dark-orange powder. This method has been successfully adapted to prepare up to 5 g of nanoparticles in a single 250 mL reaction vessel.

The following examples serve to explain embodiments of the present invention in more detail. These examples are not to be construed as being exhaustive or exclusive as to the scope of this invention.

EXAMPLES

Example 1

Synthesis of CuInS$_2$ Particles

Two (2) molar equivalents of Ph$_3$P (10.00 grams, 38.13 millimoles) may be added to fifty (50) milliliters (mL) of benzyl acetate (C$_6$H$_5$CH$_2$CO$_2$CH$_3$, 99%) to form a solution, which may be stirred. The benzyl acetate may be obtained commercially from Alfa Aesar (Ward Hill, Mass.). One (1) molar equivalent of anhydrous Cu(I)Cl (1.885 grams, 19.06 millimoles) may be added to the stirring solution and heated for about four (4) hours at eighty (80) degree Celsius (° C.) to form a white suspension including the intermediate product (Ph$_3$P)$_2$Cu—Cl. One (1) molar equivalent of anhydrous InCl$_3$ (4.22 grams, 19.06 millimoles) may be added, after which this solution may be stirred for about sixty (60) minutes at eighty (80) degree Celsius (° C.). Four (4) molar equivalents of NaSEt (7.000 grams, 83.21 millimoles) may be added to this solution and stirred for an additional twelve (12) hours at eighty (80)° C. Twenty five (25) milliliters (mL) of 3-mercaptopropionic acid may be added, after which this solution may be stirred for about one hundred and twenty (120) minutes at one hundred and seventy (170) degree Celsius (° C.). 3-mercaptopropionic acid may be obtained commercially from Acros Organics (Geel, Belgium). The resulting particles may be isolated from the benzyl acetate solution by centrifugation, collected, washed one time with methanol ($CH_3OH$) or with another suitable solvent, washed two times with 75:25 (v/v) mixture of methanol and water ($CH_3OH:H_2O$) or with another suitable solvent, and washed two times with methanol ($CH_3OH$) or with another suitable solvent. The particles may be then dried under vacuum pressure to provide yellow to black powder. For example, about 4.2 g of the $CuInS_2$ particles may be prepared in the 200 mL vessel.

Figure 2:
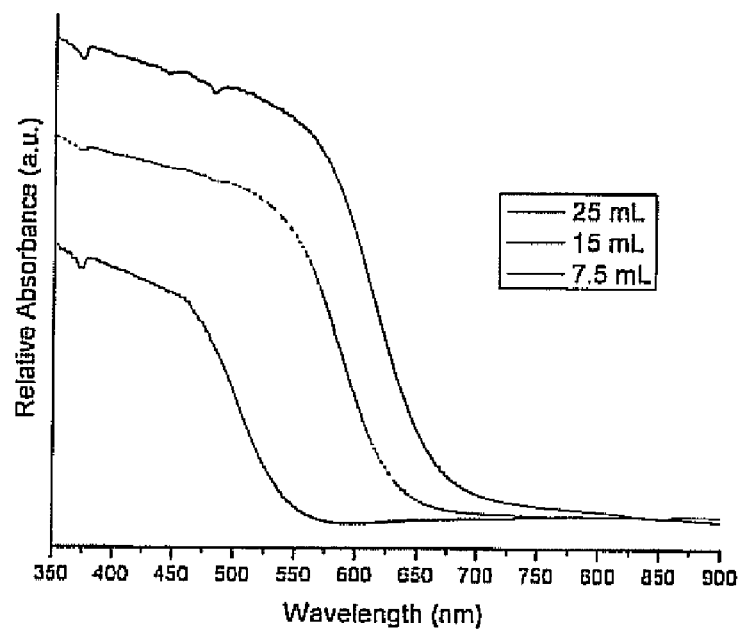
FIG. 2 is UV-Vis absorption spectra of typical $CuInS_2$ nanoparticles prepared from 7.5, 15, and 25 mL 3-mercaptopropionic acid respectively from left to right in benzyl acetate at 170° C.

FIG. 2 is a normalized UV-Vis absorption spectra of three different $CuInS_2$ nanoparticles or specimens prepared from 7.5 mL, 15 mL and 25 mL, respectively from left-to-right, 3-mercaptopropionic acid in benzyl acetate at 170° C. The absorption peaks shifted to lower energy as the $CuInS_2$ particles were grown at increasing amounts of 3-mercaptopropionic acid. The absorption behaviors of the nanoparticles showed the expected blue-shift with decreasing sizes as decreasing concentration of 3-mercaptopropionic acid which represent small to large bandgaps.

Figure 3:
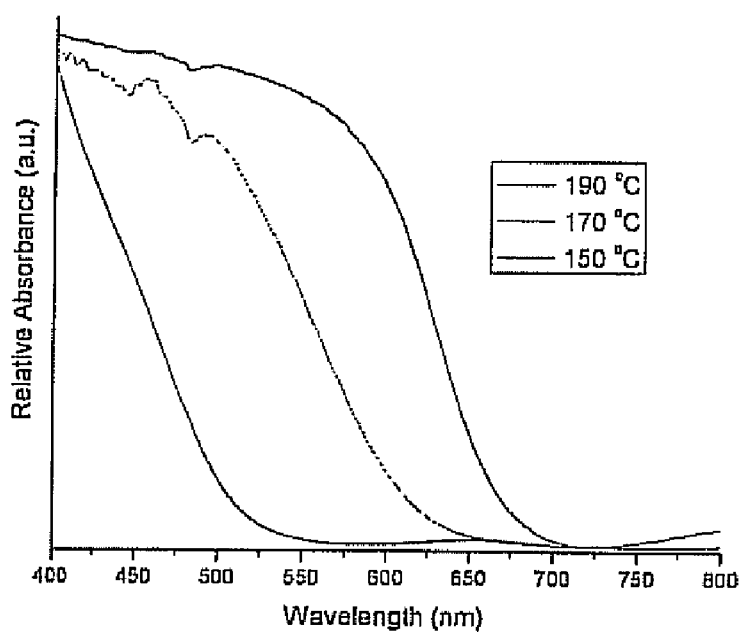
FIG. 3 is UV-Vis absorption spectra of typical $CuInS_2$ nanoparticles prepared at 150° C., 170° C. and 190° C. from left-to-right respectively.

FIG. 3 is a normalized UV-Vis absorption spectra of three different $CuInS_2$ nanoparticles or specimens prepared from 150° C., 170° C. and 190° C. from left-to-right respectively. The absorption peaks shifted to lower energy as the $CuInS_2$ particles were grown at increasing reaction temperatures. The absorption behaviors of the nanoparticles showed the expected blue-shift with decreasing sizes which represent small to large bandgaps.

Figure 4:
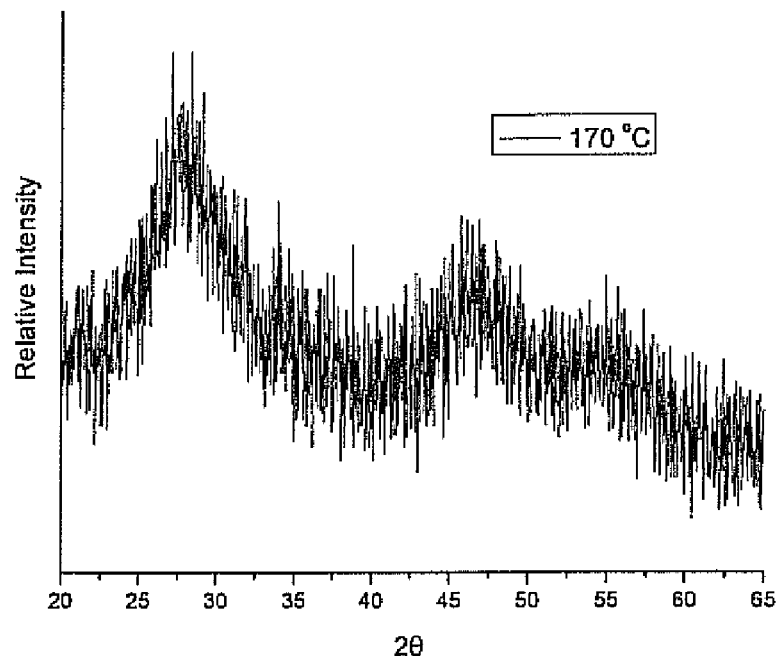
FIG. 4 is XRD data of $CuInS_2$ nanoparticles prepared at 170° C.

FIG. 4 shows normalized X-Ray Diffraction (XRD) data obtained from the $CuInS_2$ nanoparticle prepared from 150 to 190° C. respectively. From the XRD data, the volume-weighted crystal diameters (Scherrer equation with a shape factor of 0.9) of the samples were determined to range from 1.8 nm to 5.2 nm as reaction temperatures were varied from 150° C. to 190° C. (FIG. 3). The nanoparticle sizes from yellow to dark-orange were confirmed by evaluation of HRTEM images. The XRD patterns show the $CuInS_2$ nanoparticles are crystalline with the Chalcopyrite phase with major peaks at 2θ=28, 46, and 55°. The peaks are consistent with tetragonal $CuInS_2$ reference pattern 85-1575 (JCPDS-03-065-2732). Furthermore, a careful evaluation of the gradual sharpening of the peaks in the XRD spectra is indicative of the increasing particle sizes with increasing reaction temperatures. The XRD patterns of chalcopyrite particles show three major peaks at 2θ=28°, 46.4° and 55° for pure $CuInS_2$. The peaks are consistent with the chalcopyrite phase of $CuInS_2$ as shown JCPDS reference patterns obtained from INTERNATIONAL CENTRE FOR DIFFRACTION DATA®, Newtown Square, Pa.).

Figure 5:
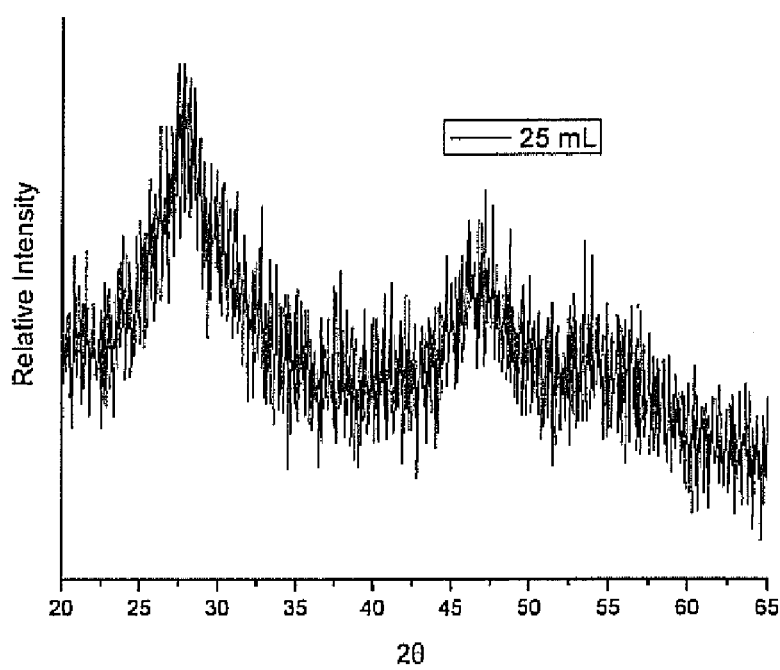
FIG. 5 is XRD data of $CuInS_2$ nanoparticles prepared from 25 mL of 3-mercaptopropionic acid at 170° C.
Figure 6:
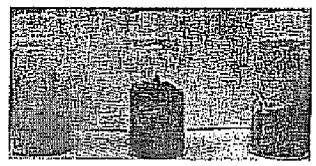
FIG. 6 is $CuInS_2$ nanoparticles prepared from 7.5, 15 and 25 mL of 3-mercaptopropionic acid respectively, from left-to-right, in benzyl acetate at 170° C.
Figure 7:
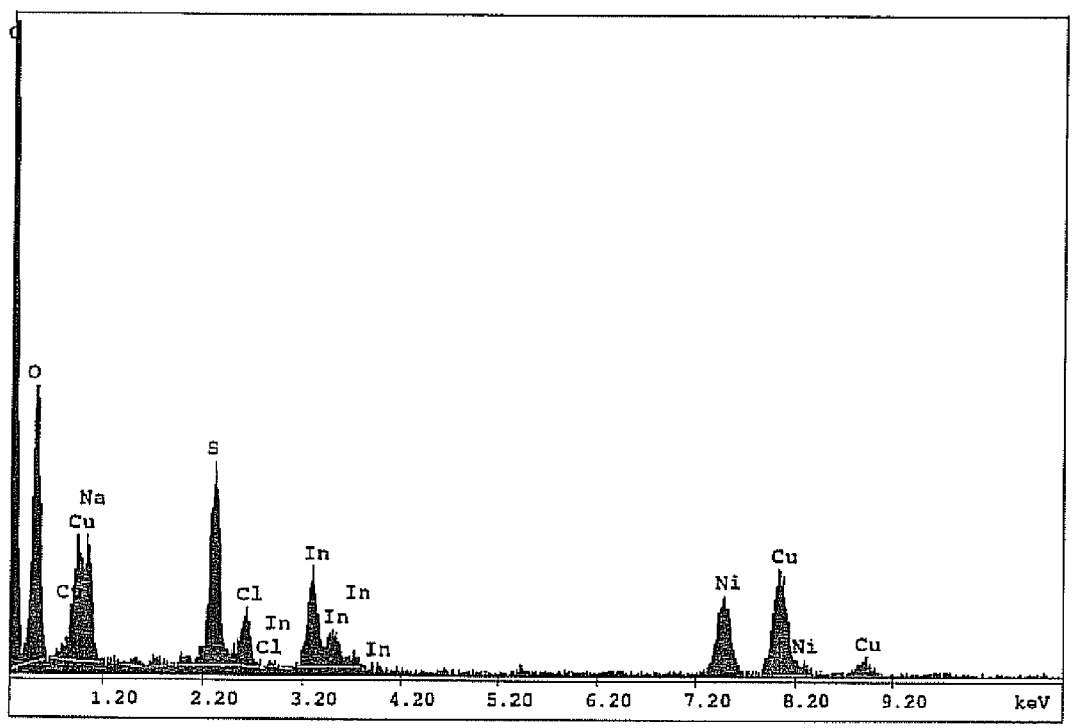
FIG. 7 illustrates EDAX data of $CuInS_2$ nanoparticles prepared from SSPs in presence of 3-mercaptopropionic acid in benzyl acetate at 170° C.

FIG. 5 shows normalized XRD data obtained from the $CuInS_2$ nanoparticle prepared from 25 mL of 3-mercaptopropionic acid at 170° C. The XRD patterns of chalcopyrite particles show three major peaks at 2θ=28°, 46.4° and 55° for pure $CuInS_2$. The peaks are consistent with the chalcopyrite phase of $CuInS_2$ as shown JCPDS reference patterns obtained from INTERNATIONAL CENTRE FOR DIFFRACTION DATA®, Newtown Square, Pa.). The XRD patterns show the $CuInS_2$ nanoparticles are crystalline with the Chalcopyrite phase with major peaks at 2θ=28, 46, and 55°. The peaks are consistent with tetragonal $CuInS_2$ reference pattern 85-1575 (JCPDS-03-065-2732).

Figure 8:
FIG. 8 illustrates $CuInS_2$ nanoparticles prepared from 1 to 2 hrs at 170° C.

Under well-controlled reaction chemistry, a heating-up SSP with sodium chloride method poses advantageous features for large-scale production of nanocrystals because the synthesis can be carried out as a reaction with a high concentration of reactants in a large-volume reactor. FIG. 5 shows the result of $CuInS_2$ nanocrystals synthesis by decomposition of 19 mmol of individual Cu and In reactants in the presence of 50 mL of benzyl acetate in a 250 mL round bottom flask at 170° C. We observed further size control based on reaction time. The reaction time for 1 hr, smaller nanoparticles size was yielded (FIG. 8 left), while the reaction time for 2 hrs larger nanoparticles size was obtained.

Example 2

Synthesis of $CuInS_2$ Particles

Two (2) molar equivalents of $Ph_3P$ (10.00 grams, 38.13 millimoles) may be added to one hundred (100) milliliters (mL) of benzyl acetate ($C_6H_5CH_2CO_2CH_3$, 99%) to form a solution, which may be stirred. The benzyl acetate may be obtained commercially from Alfa Aesar (Ward Hill, Mass.). One (1) molar equivalent of anhydrous Cu(I)Cl (1.885 grams, 19.06 millimoles) may be added to the stirring solution and heated for about four (4) hours at eighty (80) degree Celsius (° C.) to form a white suspension including the intermediate product $(Ph_3P)_2Cu$—Cl. One (1) molar equivalent of anhydrous $InCl_3$ (4.22 grams, 19.06 millimoles) may be added, after which this solution may be stirred for about sixty (60) minutes at eighty (80) degree Celsius (° C.). Four (4) molar equivalents of NaSEt (7.000 grams, 83.21 millimoles) may be added to this solution and stirred for an additional twelve (12) hours at eighty (80)° C. Twenty five (25) milliliters (mL) of 3-mercaptopropionic acid may be added, after which this solution may be stirred for about one hundred and twenty (120) minutes at one hundred and seventy (170) degree Celsius (° C.). 3-mercaptopropionic acid may be obtained commercially from Acros Organics (Geel, Belgium). The resulting particles may be isolated from the benzyl acetate solution by centrifugation, collected, washed one time with methanol ($CH_3OH$) or with another suitable solvent, washed two times with 75:25 (v/v) mixture of methanol and water ($CH_3OH:H_2O$) or with another suitable solvent, and washed two times with methanol ($CH_3OH$) or with another suitable solvent. The particles may be then dried under vacuum pressure to provide yellow to black powder. For example, about 4.7 g of the $CuInS_2$ particles may be prepared in the 200 mL vessel.

Example 3

Synthesis of $CuInS_2$ Particles

Two (2) molar equivalents of $Ph_3P$ (10.00 grams, 38.13 millimoles) may be added to one hundred (100) milliliters (mL) of benzyl acetate ($C_6H_5CH_2CO_2CH_3$, 99%) to form a solution, which may be stirred. The benzyl acetate may be obtained commercially from Alfa Aesar (Ward Hill, Mass.). One (1) molar equivalent of anhydrous Cu(I)Cl (1.885 grams, 19.06 millimoles) may be added to the stirring solution and heated for about four (4) hours at eighty (80) degree Celsius (° C.) to form a white suspension including the intermediate product $(Ph_3P)_2Cu$—Cl. One (1) molar equivalent of anhydrous $InCl_3$ (4.22 grams, 19.06 millimoles) may be added, after which this solution may be stirred for about sixty (60) minutes at eighty (80) degree Celsius (° C.). Four (4) molar equivalents of NaSEt (7.000 grams, 83.21 millimoles) may be added to this solution and stirred for an additional twelve (12) hours at eighty (80)° C. Twenty five (25) milliliters (mL) of 3-mercaptopropionic acid may be added, after which this solution may be stirred for about one hundred and twenty (120) minutes at one hundred and fifty (150) degree Celsius (° C.). 3-mercaptopropionic acid may be obtained commercially from Acros Organics (Geel, Belgium). The resulting particles may be isolated from the benzyl acetate solution by centrifugation, collected, washed one time with methanol (CH$_3$OH) or with another suitable solvent, washed two times with 75:25 (v/v) mixture of methanol and water (CH$_3$OH:H$_2$O) or with another suitable solvent, and washed two times with methanol (CH$_3$OH) or with another suitable solvent. The particles may be then dried under vacuum pressure to provide yellow to black powder. For example, about 2.0 g of the CuInS$_2$ particles may be prepared in the 200 mL vessel.

Example 4

Synthesis of CuInS$_2$ Particles

Two (2) molar equivalents of Ph$_3$P (10.00 grams, 38.13 millimoles) may be added to one hundred (100) milliliters (mL) of benzyl acetate (C$_6$H$_5$CH$_2$CO$_2$CH$_3$, 99%) to form a solution, which may be stirred. The benzyl acetate may be obtained commercially from Alfa Aesar (Ward Hill, Mass.). One (1) molar equivalent of anhydrous Cu(I)Cl (1.885 grams, 19.06 millimoles) may be added to the stirring solution and heated for about four (4) hours at eighty (80) degree Celsius (° C.) to form a white suspension including the intermediate product (Ph$_3$P)$_2$Cu—Cl. One (1) molar equivalent of anhydrous InCl$_3$ (4.22 grains, 19.06 millimoles) may be added, after which this solution may be stirred for about sixty (60) minutes at eighty (80) degree Celsius (° C.). Four (4) molar equivalents of NaSEt (7.000 grams, 83.21 millimoles) may be added to this solution and stirred for an additional twelve (12) hours at eighty (80)° C. Ten (10) milliliters (mL) of 1,2-ethanedithiol may be added, after which this solution may be stirred for about one hundred and twenty (120) minutes at one hundred and seventy (170) degree Celsius (° C.). 1,2-ethanedithiol may be obtained commercially from Alfa Aesar (Ward Hill, Mass.). The resulting particles may be isolated from the benzyl acetate solution by centrifugation, collected, washed one time with methanol (CH$_3$OH) or with another suitable solvent, washed two times with 75:25 (v/v) mixture of methanol and water (CH$_3$OH:H$_2$O) or with another suitable solvent, and washed two times with methanol (CH$_3$OH) or with another suitable solvent. The particles may be then dried under vacuum pressure to provide yellow to black powder. For example, about 7.1 g of the CuInS$_2$ particles may be prepared in the 200 mL vessel.

Example 5

Synthesis of CuInS$_2$ Particles

Two (2) molar equivalents of i-Bu$_3$P (9.50 milliliters, 38.13 millimoles) may be added to fifty (50) milliliters (mL) of benzyl acetate (C$_6$H$_5$CH$_2$CO$_2$CH$_3$, 99%) to form a solution, which may be stirred. The benzyl acetate may be obtained commercially from Alfa Aesar (Ward Hill, Mass.). One (1) molar equivalent of anhydrous Cu(I)Cl (1.885 grams, 19.06 millimoles) may be added to the stirring solution and heated for about four (4) hours at eighty (80) degree Celsius (° C.) to form a white suspension including the intermediate product (Ph$_3$P)$_2$Cu—Cl. One (1) molar equivalent of anhydrous InCl$_3$ (4.22 grams, 19.06 millimoles) may be added, after which this solution may be stirred for about sixty (60) minutes at eighty (80) degree Celsius (° C.). Four (4) molar equivalents of NaSEt (7.000 grams, 83.21 millimoles) may be added to this solution and stirred for an additional twelve (12) hours at eighty (80)° C. Twenty five (25) milliliters (mL) of 3-mercaptopropionic acid may be added, after which this solution may be stirred for about one hundred and twenty (120) minutes at one hundred and seventy (170) degree Celsius (° C.). 3-mercaptopropionic acid may be obtained commercially from Acros Organics (Geel, Belgium). The resulting particles may be isolated from the benzyl acetate solution by centrifugation, collected, washed one time with methanol (CH$_3$OH) or with another suitable solvent, washed two times with 75:25 (v/v) mixture of methanol and water (CH$_3$OH:H$_2$O) or with another suitable solvent, and washed two times with methanol (CH$_3$OH) or with another suitable solvent. The particles may be then dried under vacuum pressure to provide yellow to black powder. For example, about 3.7 g of the CuInS$_2$ particles may be prepared in the 200 mL vessel.

Example 6

Synthesis of CuInS$_y$Se$_{2-y}$ Particles

Two (2) molar equivalents of Ph$_3$P (10.00 grams, 38.13 millimoles) may be added to one hundred (100) milliliters (mL) of benzyl acetate (C$_6$H$_5$CH$_2$CO$_2$CH$_3$, 99%) to form a solution, which may be stirred. The benzyl acetate may be obtained commercially from Alfa Aesar (Ward Hill, Mass.). One (1) molar equivalent of anhydrous Cu(I)Cl (1.885 grams, 19.06 millimoles) may be added to the stirring solution and heated for about four (4) hours at eighty (80) degree Celsius (° C.) to form a white suspension including the intermediate product (Ph$_3$P)$_2$Cu—Cl. One (1) molar equivalent of anhydrous InCl$_3$ (4.22 grams, 19.06 millimoles) may be added, after which this solution may be stirred for about sixty (60) minutes at eighty (80) degree Celsius (° C.). Four (4) molar equivalents of NaSEt (7.000 grams, 83.21 millimoles) may be added to this solution and stirred for an additional twelve (12) hours at eighty (80)° C. One (1) milliliter of phenylselenol and twenty five (25) milliliters (mL) of 3-mercaptopropionic acid may be added, after which this solution may be stirred for about one hundred and twenty (120) minutes at one hundred and seventy (170) degree Celsius (° C.). 3-mercaptopropionic acid and phenylselenol may be obtained commercially from Acros Organics (Geel, Belgium). The resulting particles may be isolated from the benzyl acetate solution by centrifugation, collected, washed one time with methanol (CH$_3$OH) or with another suitable solvent, washed two times with 75:25 (v/v) mixture of methanol and water (CH$_3$OH:H$_2$O) or with another suitable solvent, and washed two times with methanol (CH$_3$OH) or with another suitable solvent. The particles may be then dried under vacuum pressure to provide yellow to black powder.

Example 7

Synthesis of CuIn$_x$Ga$_{1-x}$S$_2$ Particles

Two (2) molar equivalents of Ph$_3$P (10.00 grams, 38.13 millimoles) may be added to one hundred (100) milliliters (mL) of benzyl acetate (C$_6$H$_5$CH$_2$CO$_2$CH$_3$, 99%) to form a solution, which may be stirred. The benzyl acetate may be obtained commercially from Alfa Aesar (Ward Hill, Mass.). One (1) molar equivalent of anhydrous Cu(I)Cl (1.885 grams, 19.06 millimoles) may be added to the stirring solution and heated for about four (4) hours at eighty (80) degree Celsius (° C.) to form a white suspension including the intermediate product (Ph$_3$P)$_2$Cu—Cl. The total one molar equivalent of anhydrous InCl$_3$ (2.951 grams, 13.34 millimoles) and anhydrous GaCl$_3$ (0.705 grams, 4.003 millimoles) may be added, after which this solution may be stirred for about sixty (60) minutes at eighty (80) degree Celsius (° C.). Four (4) molar equivalents of NaSEt (7.000 grams, 83.21 millimoles) may be added to this solution and stirred for an additional twelve (12) hours at eighty (80)° C. Twenty five (25) milliliters (mL) of 3-mercaptopropionic acid may be added, after which this solution may be stirred for about one hundred and eighty (180) minutes at one hundred and seventy (170) degree Celsius (° C.). 3-mercaptopropionic acid may be obtained commercially from Acros Organics (Geel, Belgium). The resulting particles may be isolated from the benzyl acetate solution by centrifugation, collected, washed one time with methanol ($CH_3OH$) or with another suitable solvent, washed two times with 75:25 (v/v) mixture of methanol and water ($CH_3OH$:$H_2O$) or with another suitable solvent, and washed two times with methanol ($CH_3OH$) or with another suitable solvent. The particles may be then dried under vacuum pressure to provide yellow to black powder. For example, about 4.1 g of the $CuIn_xGa_{1-x}S_2$ particles may be prepared in the 200 mL vessel.

Potentially, these nanocrystals can be incorporated into next-generation quantum-dot-based solar cells. We have shown that by exploiting the conventional convective heating method one-pot decomposition of single source precursors of $CuInS_2$ in the presence of 3-mercaptopropionic acid and NaCl, we can prepare $CuInS_2$ nanoparticles with diameters ranging from 1.8-5.2 nm with very high-yield of Chalcopyrite $CuInS_2$ nanocrystals. Short reaction times of 3 hours or less are required for the preparation of these nanoparticles. The reaction temperature, 3-mercaptopropionic acid concentration, and reaction time are all critical for fine control of nanoparticle size. Gram quantities of $CuInS_2$ nanoparticles can be obtained by the method developed in this study, demonstrating its potential for providing ultra-large quantities of tunable I-III-$VI_2$ compound nanoparticles with small amount of solvent in applications for low-cost non-vacuum-based CIS solar cells.

Transmission electron microscopy (TEM) images were taken with a JEOL JEM 2100 transmission electron microscope using a LaB6-Cathode and an acceleration voltage of 200 kV. Energy-dispersive X-ray (EDX) analysis was also conducted on a JEOL JEM 2100 transmission electron microscope equipped with a Sapphire Si(Li) detecting unit from EDAX, using an acceleration voltage of 200 kV. Powder X-ray diffraction (XRD) patterns were acquired with a PANalytical X'Pert Pro X-ray powder diffraction system using incident beam hardware: Ceramic tube (Cu anode), soller slit 0.04 radians, divergence slit ½, mask 10 mm and diffracted beam hardware: anti-scattering slit ½, Ni-filter, receiving slit ¼, soller slit 0.04 radians, proportional detector (Xe-filled). Scans were collected for 25 min employing a 0.06° step width at a rate of 2 s/step resulting in a 2θ scan range from 20-65°. Absorption spectra of nanoparticles were obtained from the UV-Vis data recorded on a Perkin Elmer Lambda 950 spectrophotometer. A plane glass was measured as the background transmission at room temperature. It was determined that the optimal temperature for formation of CIS nanocrystals is around 150° C. Hepp et al. synthesized CIS nanocrystals by injecting the 1-hexanethiol into solution of SSP in dioctyl phthalate at temperatures above 200° C. and observed formation of CIS for 5 hr using traditional heating methods. S. L. Castro, S. G. Bailey, R. P. Raffaelle, K. K. Banger, and A. F. Hepp, *J. Phys. Chem. B*, 2004, 108, 12429. The dioctyl phthalate was heated at 125° C. for 1 hr under vacuum in order to dry and degas. The SSP was heated in degassed dioctyl phthalate at 150° C. in order to dissolve. Hepp et al. also synthesized CIS nanocrystals without addition of any additional thiol into solution of SSP in dioctyl phthalate at temperatures above 250° C. S. L. Castro, S. G. Bailey, R. P. Raffaelle, K. K. Banger, and A. F. Hepp, *Chem. Mater.*, 2003, 15, 3142. At 200° C., the CIS was not formed, only intermediate precursor comprising a mixture of $Cu_xS_y$ and $In_xS_y$ as their hypothesized. These results suggest that in order to avoid formation of the intermediate precursor the optimal temperature for the synthesis of CIS nanocrystals should be above 200° C. Therefore, our strategy for avoiding the formation of the intermediate precursor was to first form the SSP complexes without filtration or separation of sodium chloride. We hypothesized that the sodium chloride could be the heat agent, which could transfer heat from the reaction flask to SSP more effectively. The starting materials (SSPs) are slightly air-sensitive and are stored in an argon filled inert atmosphere drybox (Vac Atmospheres) to prevent decomposition. Accordingly, steps involving filtering, evaporating, and drying were eliminated. This enables the formation of SSP complexes without expose to the air. Note that the total reaction time and work up for synthesis of CIS nanocrystals using our procedure is much shorter than that reported for converting the SSP to $CuInS_2$ nanocrystals. Sodium chloride was dissolved and washed out using 75:25 (v/v) mixtures of $CH_3OH$ and $H_2O$. Thus, $CuInS_2$ (CIS) nanocrystals can be efficiently synthesized by one-pot reaction, first mixing and forming a clear solution mixture of the SSP at 80° C. and then heating up the mixture to a temperature of 150-190° C. in 3-mercaptopropionic acid for product formation (CIS nanocrystals) via conventional heating technique.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. A method of creating nanoparticles, the method comprising:
   Preparing a solution of at least one single source precursor in the presence of at least one thiol and at least one salt that is stable in a reaction flask to avoid said at least one single source precursor from being exposed to the atmosphere; and
   heating said solution to decompose said at least one single source precursor into a plurality of nanoparticles having sizes no greater than 20 nm from said at least one single source precursor in a single pot reaction.

2. The method of claim 1, further comprising the step of removing said at least one salt after said nanoparticles are formed.

3. The method of claim 1, wherein decomposing at least one single source precursor comprises exposing said at least one single source precursor to a temperature in excess of 100° C. for a time selected to create nanoparticles having predetermined sizes.

4. The method of claim 1, wherein said at least one single source precursor includes a compound generally represented by the formula I-III-$VI_2$, wherein I represents an element in Group I (Groups IA (1) and IB (11)) of the periodic table; wherein III refers to an element in Group III (Groups IIIB (3) and IIIA (13)) of the periodic table; and wherein VI refers to an element in Group VI (Groups VIB (6) and VIA (16)) of the periodic table.

5. The method of claim 1, wherein said at least one single source precursor are molecules that have the empirical formula $[L_2N(\mu\text{-}ER)_2M(ER)_2]$ (or $L_2NM(ER)_4$), wherein L is a Lewis base that is coordinated to N by a dative bond, each N is individually selected from Group IB atoms, each M is individually selected from Group IIIA atoms, each E is individually selected from Group VIA atoms, and each R is individually selected from the group consisting of alkyl, aryl, vinyl, (per)fluoro alkyl, (per)fluoro aryl, silane, and carbamato groups.

6. The method of claim 1, wherein said at least one thiol is selected from the group essentially consisting of 3-mercaptopropionic acid, 1,2-ethanedithiol, 1,1-methanedithiol, 3-mercaptobenzoic, phenyl-1,2-ethanedithiol, thiophenol, thiosalicylic acid, 1,3-propanedithiol, 2,2-propanedithiol, 1,2-propanedithiol, 2,2-dimethyl-1,3-propanedithiol, 1,3-diphenyl-2,2-propanedithiol, 1,4-butanedithiol, 2,3-butanedithiol, 2,2-butanedithiol, 1,3-isobutanedithiol, 1,5-pentanedithiol, 1,6-hexanedithiol, and 1,2-hexanedithiol.

7. The method of claim 1, wherein said at least one salt is selected from the group essentially consisting of NaCl, NaBr, NaF, NaI, KCl, KBr, KF, KI, LiCl, LiBr, LiF, and/or LiI.

8. The method of claim 1, wherein said heating step is conducted at a temperature and for a time in the presence of said salt to produce nanoparticles of a desired size.

9. The method of claim 1, wherein said step of preparing said solution comprises the step of combining single source precursor forming materials with said salt forming materials in a liquid solvent at a temperature that is maintained substantially constant until said single source precursor is formed.

10. The method of claim 9, wherein said single source precursor forming materials includes a source for at least one of the following: element in Group I (Cu and/or Ag) of the periodic table, element in Group III (Al, Ga and/or In) of the periodic table, and element in Group VI (O, S, Se and/or Te) of the periodic table.

11. The method of claim 10, wherein said source material is selected from the group essentially consisting of: CuCl, CuI, CuF, CuBr, AgCl, AgI, AgF, and AgBr.

12. The method of claim 10, wherein said source is selected from the group essentially consisting of: $InCl_3$, $InBr_3$, $InF_3$, $InI_3$, $GaCl_3$, $GaBr_3$, $GaF_3$, $GaI_3$, $AlCl_3$, $AlBr_3$, $AlF_3$, and $AlI_3$.

13. The method of claim 10, wherein said source forming material is combined with a salt and precursor forming material selected from the group essentially consisting of: NaSEt, KSEt, and LiSEt.

14. The method of claim 10, wherein said solution is heated to a temperature selected from the range of 100°-300° C.

15. The method of claim 14, wherein said temperature is selected within the range of 120°-200° C.

16. The method of claim 14, wherein said liquid solvent is separated from said nanoparticles following creation of nanoparticles.

17. The method of claim 16, wherein said solvent is selected to have a boiling point higher than any temperature to which said solvent is exposed prior to creation of said nanoparticles.

18. The method of claim 17, wherein said solvent is benzyl acetate.

19. A method of forming a semiconductor material comprising: forming nanoparticles no greater than 20 nm from a I-III-$VI_2$ material in a chalcopyrite phase while in a stable salt solution by decomposing same in a single pot reaction.

20. Method of synthesizing chalcopyrite-based semi-conductor nanoparticles comprising the steps of:
mixing $Ph_3P$ with benzyl acetate to form a solution;
heating the solution;
adding anhydrous CuCl to the solution and stirring;
adding $InCl_3$ and NaSEt to the solution to form salt and a single source precursor;
adding 3-mercatopropionic acid to form a reaction mixture;
heating the resulting mixture and maintaining the temperature within the range of about 150° C.-200° C. for approximate 2 hours to form $CuInS_2$ nanoparticles in the chalcopyrite phase; and
controlling the reaction temperature, reaction time; concentration to form desired $CuInS_2$ chalcopyrite particle size in a single pot reaction.

* * * * *